United States Patent
Moon et al.

(10) Patent No.: US 12,029,081 B2
(45) Date of Patent: Jul. 2, 2024

(54) ORGANIC LIGHT-EMITTING DISPLAY APPARATUS INCLUDING A CONTACT AREA EXPOSING A CONDUCTIVE LAYER OVERLAPPING A SPACER

(71) Applicant: Samsung Display Co., Ltd., Yongin-si (KR)

(72) Inventors: Sangho Moon, Yongin-si (KR); Chungi You, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 405 days.

(21) Appl. No.: 17/028,967

(22) Filed: Sep. 22, 2020

(65) Prior Publication Data
US 2021/0126081 A1 Apr. 29, 2021

(30) Foreign Application Priority Data
Oct. 29, 2019 (KR) .................. 10-2019-0135757

(51) Int. Cl.
*H10K 59/131* (2023.01)
*H10K 59/122* (2023.01)

(52) U.S. Cl.
CPC ......... *H10K 59/131* (2023.02); *H10K 59/122* (2023.02)

(58) Field of Classification Search
CPC ............ H01L 27/3276; H01L 27/3246; H10K 59/131; H10K 59/122
See application file for complete search history.

(56) References Cited

U.S. PATENT DOCUMENTS

| | | | | |
|---|---|---|---|---|
| 9,748,512 | B2* | 8/2017 | Kim | H01L 51/0097 |
| 2010/0097295 | A1* | 4/2010 | Kwak | H01L 51/5284 345/32 |
| 2010/0207107 | A1* | 8/2010 | Kim | H01L 51/525 257/E33.044 |
| 2014/0167006 | A1* | 6/2014 | Kim | B29C 59/046 264/293 |
| 2014/0183479 | A1* | 7/2014 | Park | H01L 27/3216 438/34 |
| 2014/0183501 | A1* | 7/2014 | Kim | H01L 27/3246 438/34 |
| 2016/0035803 | A1* | 2/2016 | Kim | H01L 27/3246 438/34 |
| 2016/0043341 | A1* | 2/2016 | Heo | H01L 27/3279 438/23 |
| 2019/0165063 | A1* | 5/2019 | Lee | H01L 51/5228 |
| 2019/0165064 | A1* | 5/2019 | Lee | H01L 27/3279 |

FOREIGN PATENT DOCUMENTS

KR  10-2016-0074333 A  6/2016

\* cited by examiner

*Primary Examiner* — Lex H Malsawma
(74) *Attorney, Agent, or Firm* — Lewis Roca Rothgerber Christie LLP

(57) ABSTRACT

An organic light-emitting display apparatus includes: a substrate; a plurality of organic light-emitting diodes on the substrate; a spacer arranged between the plurality of organic light-emitting diodes and protruding away from an upper surface of the substrate; a conductive layer overlapping the spacer; and a contact area exposing the conductive layer on one side of the spacer, wherein a common layer of the plurality of organic light-emitting diodes and the conductive layer are connected to each other through the contact area.

20 Claims, 15 Drawing Sheets

ORGANIC LIGHT-EMITTING DISPLAY APPARATUS INCLUDING A CONTACT AREA EXPOSING A CONDUCTIVE LAYER OVERLAPPING A SPACER

CROSS-REFERENCE TO RELATED APPLICATION

This application claims priority to and the benefit of Korean Patent Application No. 10-2019-0135757, filed on Oct. 29, 2019, in the Korean Intellectual Property Office, the entire disclosure of which is hereby incorporated by reference.

BACKGROUND

1. Field

One or more embodiments relate to an organic light-emitting display apparatus, and more particularly, to an organic light-emitting display apparatus with improved reliability.

2. Description of Related Art

An organic light-emitting display apparatus is a self-luminescent display device that includes an organic light-emitting device having a hole-injecting electrode, an electron-injecting electrode, and an organic light-emitting layer formed therebetween. Thus, the organic light-emitting display apparatus emits light as excitons (generated when holes injected by the hole-injecting electrode and electrons injected by the electron-injecting electrode combine with each other at the organic light-emitting layer) transit from an excited state to a ground state.

Because the organic light-emitting display apparatus is a self-luminescent display apparatus and requires no separate light source, the organic light-emitting display apparatus may be driven with a low voltage, may be configured to be lightweight and thin, and may exhibit excellent characteristics such as a wide viewing angle, high contrast, and fast response speed. Therefore, the organic light-emitting display apparatus has been spotlighted as (e.g., is considered to be) a next-generation display apparatus.

SUMMARY

One or more aspects of embodiments are directed toward an organic light-emitting display apparatus having high reliability against external pressure.

Additional aspects will be set forth in part in the description which follows and, in part, will be apparent from the description, or may be learned by practice of the disclosed embodiments of the present disclosure.

According to one or more embodiments, an organic light-emitting display apparatus includes a substrate; a plurality of organic light-emitting diodes on the substrate; a spacer arranged between the plurality of organic light-emitting diodes and protruding away from an upper surface of the substrate; a conductive layer arranged to overlap the spacer; and a contact area exposing the conductive layer on one side of the spacer, wherein a common layer of the plurality of organic light-emitting diodes and the conductive layer are connected to each other through the contact area.

In an embodiment, the contact area may surround the spacer.

In an embodiment, the conductive layer may be on same layer as pixel electrodes of the plurality of organic light-emitting diodes and may be spaced apart from the pixel electrodes.

In an embodiment, the conductive layer may be a line for transmitting a common power supply voltage.

In an embodiment, an area of the conductive layer corresponding to the spacer may be greater than an area of the spacer when viewed from a plan view.

In an embodiment, the conductive layer may be on a different layer than the pixel electrodes of the organic light-emitting diodes.

In an embodiment, the conductive layer may overlap at least a portion of the pixel electrodes of the organic light-emitting diodes.

In an embodiment, the organic light-emitting display apparatus may further include a first line below the conductive layer, wherein the conductive layer may be connected to the first line through a via hole.

In an embodiment, the first line may be configured to transmit a common power supply voltage.

In an embodiment, the conductive layer may include a first connection electrode and a second connection electrode, and the first connection electrode may be connected to the first line through a first via hole, and the second connection electrode may be connected to the first line through a second via hole.

In an embodiment, the organic light-emitting display apparatus may further include a thin-film transistor on the substrate; and a first planarization layer and a second planarization layer arranged and stacked between the thin-film transistor and the plurality of organic light-emitting diodes, wherein the conductive layer may be between the first planarization layer and the second planarization layer.

In an embodiment, the contact area may include a plurality of contact holes that surround the spacer.

In an embodiment, the organic light-emitting display apparatus may further include a pixel-defining layer covering an edge of the pixel electrodes of the plurality of organic light-emitting diodes and having an opening exposing a center of the pixel electrodes, wherein the spacer may protrude from an upper surface of the pixel-defining layer.

According to one or more embodiments, an organic light-emitting display apparatus includes a substrate; a plurality of organic light-emitting diodes on the substrate; a pixel-defining layer covering an edge of a pixel electrode of each of the organic light-emitting diodes and exposing a center portion of the pixel electrode; a spacer arranged on the pixel-defining layer between the plurality of organic light-emitting diodes and protruding from an upper surface of the pixel-defining layer; a first line overlapping the spacer; and a contact area exposing the first line at one side of the spacer, wherein a common layer of the plurality of organic light-emitting diodes and the first line are connected to each other through the contact area.

In an embodiment, the contact area may surround the spacer.

In an embodiment, the first line may be on same layer as the pixel electrodes of the plurality of organic light-emitting diodes and may be spaced apart from the pixel electrodes.

In an embodiment, the first line may be configured to transmit a common power supply voltage.

In an embodiment, the organic light-emitting display apparatus may further include a thin-film transistor on the substrate; and a first planarization layer and a second planarization layer arranged and stacked between the thin-film transistor and the plurality of organic light-emitting diodes, wherein the first line may be between the first planarization layer and the second planarization layer.

In an embodiment, the organic light-emitting display apparatus may further include a sealing substrate arranged to face the substrate.

In an embodiment, the organic light-emitting display apparatus may further include a thin-film encapsulation layer arranged to cover the plurality of organic light-emitting diodes, wherein the thin-film encapsulation layer includes a first inorganic encapsulation layer, an organic encapsulation layer, and a second inorganic encapsulation layer that are sequentially stacked.

BRIEF DESCRIPTION OF THE DRAWINGS

The above and other aspects, features, and advantages of embodiments of the present disclosure will be more apparent from the following description in conjunction with the accompanying drawings, in which.

DETAILED DESCRIPTION

Figure 1:
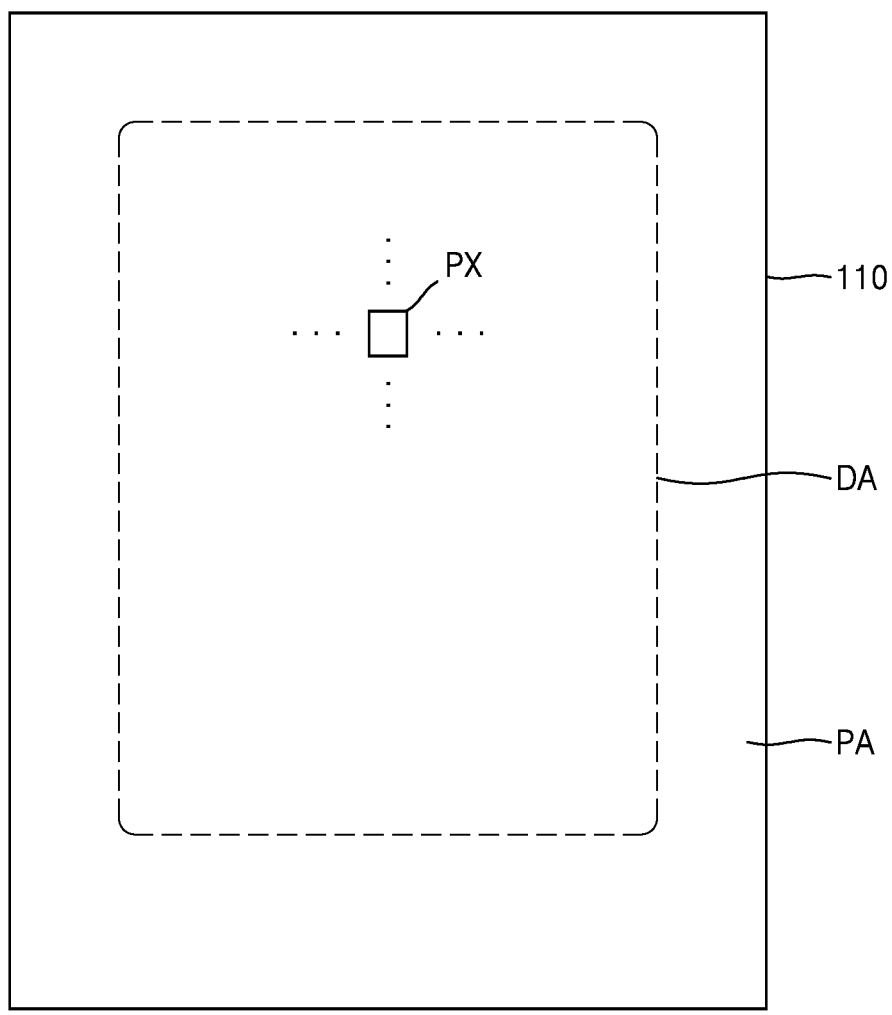
FIG. 1 is a plan view of an organic light-emitting display apparatus according to an embodiment.

Reference will now be made in detail to embodiments, examples of which are illustrated in the accompanying drawings, wherein like reference numerals refer to like elements throughout. In this regard, the disclosed embodiments may have different forms and should not be construed as being limited to the corresponding descriptions set forth herein. Accordingly, the disclosed embodiments are merely described below, by referring to the figures, to explain aspects of the present disclosure. As used herein, the term "and/or" includes any and all combinations of one or more of the associated listed items. Throughout the disclosure, the expression "at least one of a, b or c" indicates only a; only b; only c; both a and b; both a and c; both b and c; all of a, b, and c; or variations thereof.

Hereinafter, embodiments will be described in detail with reference to the accompanying drawings. The same reference numerals are used to denote the same elements, and repeated descriptions thereof will not be provided. Herein, the use of the term "may," when describing embodiments of the present invention, refers to "one or more embodiments of the present invention."

It will be understood that although the terms "first," "second," etc. may be used herein to describe various components, these components should not be limited by these terms.

An expression used in the singular encompasses the expression of the plural, unless the context clearly indicates otherwise.

It will be further understood that the terms "comprises," "comprising," "includes," and "including" used herein specify the presence of stated features and/or elements, but do not preclude the presence or addition of one or more other features and/or elements.

It will be understood that when a layer, region, or element is referred to as being "on" another layer, region, or element, it can be directly or indirectly on the other layer, region, or element. For example, intervening layer(s), region(s), or element(s) may be present.

Sizes of elements in the drawings may be exaggerated for convenience of explanation. For example, sizes and thicknesses of components in the drawings may be arbitrarily illustrated for convenience of explanation, and the following embodiments are not limited thereto.

When a certain embodiment may be implemented differently, a disclosed process order may be performed differently from the described order. For example, two consecutively (e.g., sequentially) described processes may be performed substantially at the same time or performed in an order opposite to the described order.

It will be understood that when a first layer, region, or component is connected (e.g., physically connected or electrically connected) to another portion, the first layer, region, or component may be directly connected to the portion or an intervening layer, region, or component may exist, such that the first layer, region, or component may be indirectly connected to the portion. For example, when a first layer, region, or component is electrically connected to another portion, the first layer, region, or component may be directly electrically connected to the portion or may be indirectly electrically connected to the portion through another layer, region, or component.

Referring to FIG. 1, an organic light-emitting display apparatus may include a display area DA and a peripheral area PA that is a non-display area. In the display area DA, sub-pixels PX including display devices are arranged to provide an image.

Each sub-pixel PX may emit light of, for example, red, green, blue, or white color, and may include, for example, an organic light-emitting diode. In addition, each sub-pixel PX may further include devices such as a thin-film transistor (TFT) and/or a capacitor.

As used herein, the sub-pixel PX refers to a unit which emits light of any one of red, green, blue or white color as described above. The sub-pixels PX may be gathered to provide (e.g., to form or to constitute) pixels that implement (e.g., that provide) various suitable colors. For example, one pixel may include a first sub-pixel emitting red light, a second sub-pixel emitting green light, and a third sub-pixel emitting blue light, and the color of the pixel may be implemented by rendering (e.g., determined by the luminance of light emitted from) the first to third sub-pixels.

The peripheral area PA is an area that does not provide an image and includes a scan driver and a data driver to provide (e.g., generate) electrical signals to be applied to the sub-pixels PX of the display area DA. The peripheral area PA may further include power lines to provide power, such as a driving voltage and a common voltage, to the sub-pixels PX.

Figure 2A:
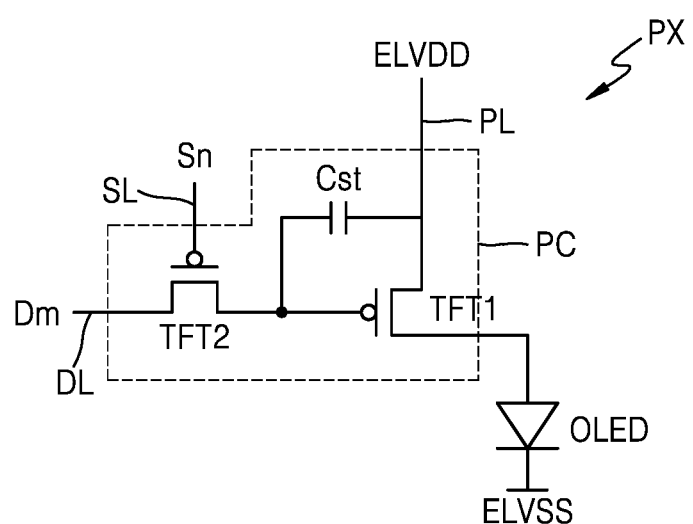
FIGS. 2A to 2C are each an equivalent circuit diagram of one pixel of an organic light-emitting display apparatus, according to an embodiment.
Figure 2B:
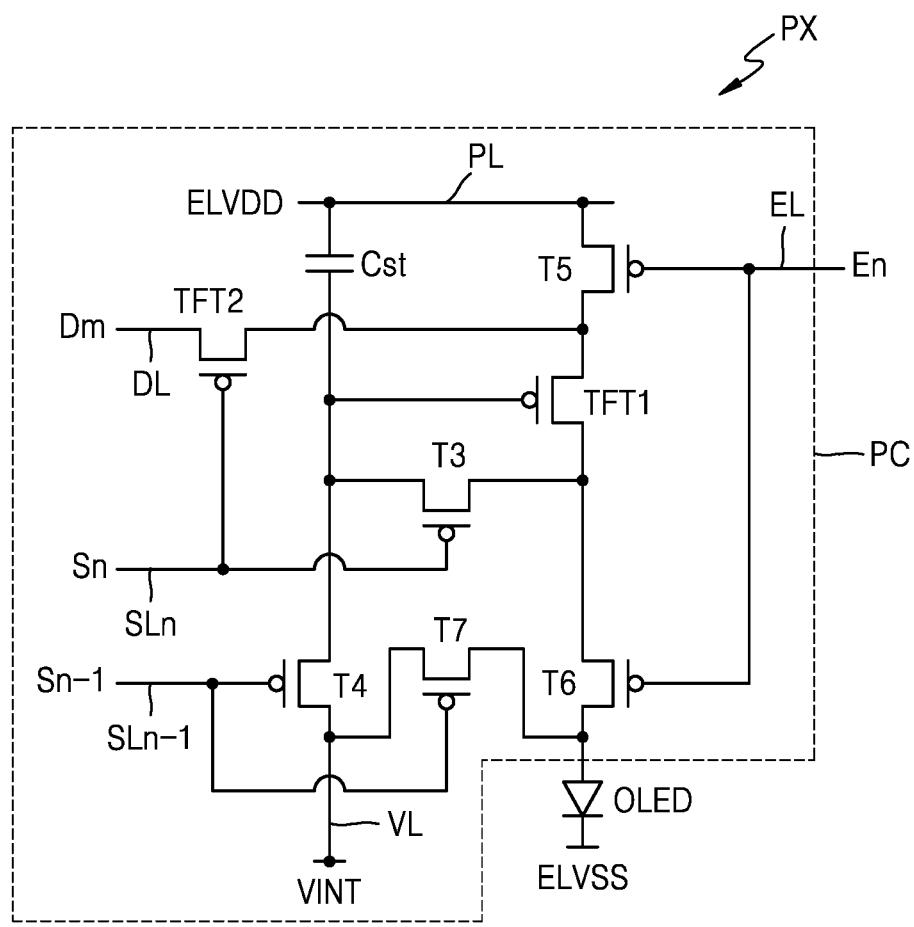
Figure 2C:
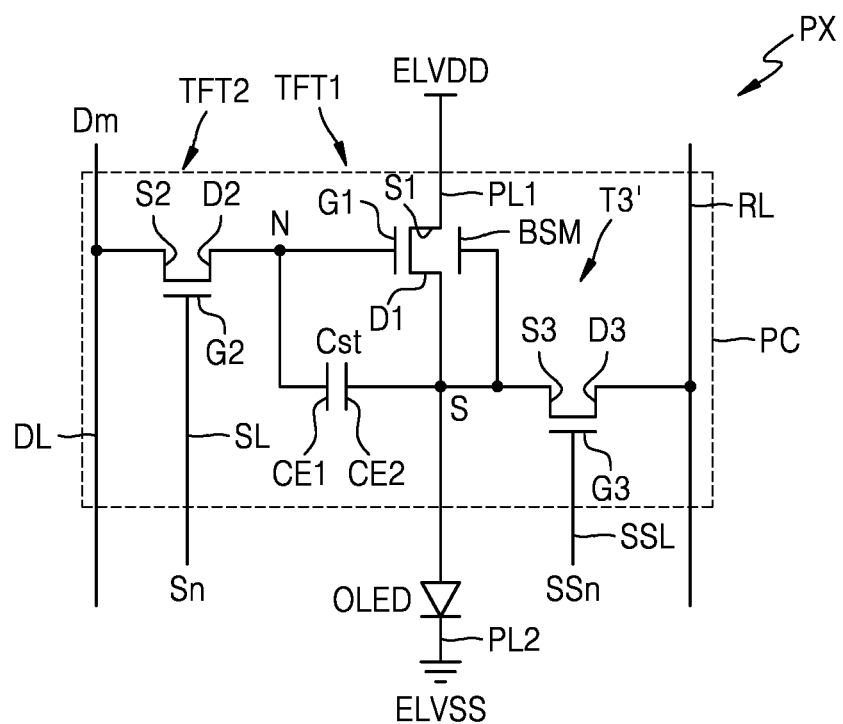

FIGS. 2A to 2C are equivalent circuit diagrams of one pixel in a display device according to an embodiment.

Referring to FIG. 2A, a pixel PX includes a pixel circuit PC connected to a scan line SL and a data line DL, and an organic light-emitting diode OLED connected to the pixel circuit PC.

As used here, when a first component is described as being "connected" to a second component, the first component may be electrically connected to the second component, but the term "connected" should not be limited thereto. The pixel circuit PC includes a driving thin-film transistor TFT1, a switching thin-film transistor TFT2, and a storage capacitor Cst. The switching thin-film transistor TFT2 is connected to the scan line SL and the data line DL, and supplies a data signal Dm input through the data line DL, according to a scan signal Sn input through the scan line SL, to the driving thin-film transistor TFT1. For example, in an embodiment, a gate electrode of the switching thin-film transistor TFT2 is connected to the scan line SL, a source electrode of the switching thin-film transistor TFT2 is connected to the data line DL, and a drain electrode of the switching thin-film transistor TFT2 is connected to a gate electrode of the driving thin-film transistor TFT1 and to a first electrode of the storage capacitor Cst.

The storage capacitor Cst is connected to the switching thin-film transistor TFT2 and a driving voltage line PL, and stores a voltage corresponding to a difference between a voltage supplied from the switching thin-film transistor TFT2 and a driving power supply voltage ELVDD supplied to the driving voltage line PL.

The driving thin-film transistor TFT1 is connected to the driving voltage line PL and the storage capacitor Cst, and may control a driving current to flow through the organic light-emitting diode OLED from the driving voltage line PL corresponding to a voltage value stored in the storage capacitor Cst. For example, in an embodiment, a gate electrode of the driving thin-film transistor TFT1 is connected to the drain electrode of the switching thin-film transistor TFT2, a source electrode of the driving thin-film transistor TFT1 is connected to the driving voltage line PL and to a second electrode of the storage capacitor Cst, and a drain electrode of the driving thin-film transistor TFT1 is connected to the organic light-emitting diode OLED. The organic light-emitting diode OLED may emit light having certain luminance according to the driving current.

Although FIG. 2A describes a case where the pixel circuit PC includes two thin-film transistors and one storage capacitor, the disclosure is not limited thereto.

Referring to FIG. 2B, the pixel circuit PC may include the driving and switching thin-film transistors TFT1 and TFT2, respectively, a compensation thin-film transistor T3, a first initialization thin-film transistor T4, an operation control thin-film transistor T5, an emission control thin-film transistor T6, and a second initialization thin-film transistor T7.

Although FIG. 2B shows a case where signal lines SLn, SLn-1, EL, and DL, an initialization voltage line VL, and the driving voltage line PL are provided for a sub-pixel PX, the disclosure is not limited thereto. In another embodiment, at least one of the signal lines SLn, SLn-1, EL, and DL, and/or the initialization voltage line VL may be shared by neighboring pixels.

A drain electrode of the driving thin-film transistor TFT1 may be electrically connected to the organic light-emitting diode OLED via the emission control thin-film transistor T6. The driving thin-film transistor TFT1 may receive the data signal Dm, according to a switching operation of the switching thin-film transistor TFT2, and supply a driving current to the organic light-emitting diode OLED.

A gate electrode of the switching thin-film transistor TFT2 is connected to the scan line SLn, and a source electrode of the switching thin-film transistor TFT2 is connected to the data line DL. A drain electrode of the switching thin-film transistor TFT2 may be connected to a source electrode of the driving thin-film transistor TFT1 and may further be connected to the driving voltage line PL via the operation control thin-film transistor T5.

The switching thin-film transistor TFT2 is turned on in response to the scan signal Sn received through the scan line SLn and may perform a switching operation to transmit the data signal Dm transmitted to the data line DL to the source electrode of the driving thin-film transistor TFT1.

A gate electrode of the compensation thin-film transistor T3 may be connected to the scan line SLn. A source electrode of the compensation thin-film transistor T3 may be connected to the drain electrode of the driving thin-film transistor TFT1 and may further be connected to a pixel electrode of the organic light-emitting diode OLED via the emission control thin-film transistor T6. A drain electrode of the compensation thin-film transistor T3 may be connected to any one electrode (e.g., a first electrode) of the storage capacitor Cst, a source electrode of the first initialization thin-film transistor T4, and a gate electrode of the driving thin-film transistor TFT1. The compensation thin-film transistor T3 is turned on in response to the scan signal Sn received through the scan line SLn to connect the gate electrode and the drain electrode of the driving thin-film transistor TFT1 to each other, thereby to diode-connect the driving thin-film transistor TFT1.

A gate electrode of the first initialization thin-film transistor T4 may be connected to a previous scan line SLn-1. A drain electrode of the first initialization thin-film transistor T4 may be connected to the initialization voltage line VL. The source electrode of the first initialization thin-film transistor T4 may be connected to any one electrode (e.g., a first electrode) of the storage capacitor Cst, the drain electrode of the compensation thin-film transistor T3, and the gate electrode of the driving thin-film transistor TFT1. The first initialization thin-film transistor T4 may be turned on in response to the previous scan signal Sn-1 received through the previous scan line SLn-1 to transmit an initialization voltage VINT to the gate electrode of the driving thin-film transistor TFT1 to perform an initialization operation for initializing the voltage of the gate electrode of the driving thin-film transistor TFT1.

A gate electrode of the operation control thin-film transistor T5 may be connected to an emission control line EL. A source electrode of the operation control thin-film transistor T5 may be connected to the driving voltage line PL. A drain electrode of the operation control thin-film transistor T5 is connected to the source electrode of the driving thin-film transistor TFT1 and also to the drain electrode of the switching thin-film transistor TFT2.

A gate electrode of the emission control thin-film transistor T6 may be connected to the emission control line EL. A source electrode of the emission control thin-film transistor T6 may be connected to the drain electrode of the driving thin-film transistor TFT1 and also to the source electrode of the compensation thin-film transistor T3. A drain electrode of the emission control thin-film transistor T6 may be electrically connected to the pixel electrode of the organic light-emitting diode OLED. The operation control thin-film transistor T5 and the emission control thin-film transistor T6 may be concurrently (e.g., simultaneously) turned on in response to an emission control signal En received through the emission control line EL so that the driving power supply voltage ELVDD is transmitted to the organic light-emitting diode OLED, and so that a driving current may flow through the organic light-emitting diode OLED.

A gate electrode of the second initialization thin-film transistor T7 may be connected to the previous scan line SLn-1. A source electrode of the second initialization thin-film transistor T7 may be connected to the pixel electrode of the organic light-emitting diode OLED. A drain electrode of the second initialization thin-film transistor T7 may be connected to the initialization voltage line VL. The second initialization thin-film transistor T7 may be turned on in response to the previous scan signal Sn-1 received through the previous scan line SLn-1 to initialize the pixel electrode of the organic light-emitting diode OLED.

Although FIG. 2B illustrates a case where the first initializing thin-film transistor T4 and the second initializing thin-film transistor T7 are connected to the previous scan line SLn-1, the disclosure is not limited thereto. In another embodiment, the first initialization thin-film transistor T4 may be connected to the previous scan line SLn-1 and driven according to the previous scan signal Sn-1, and the second initialization thin-film transistor T7 may be connected to a separate signal line (e.g., a next scan line) and driven according to a signal transmitted from the corresponding scan line (e.g., from the separate signal line).

The other electrode (e.g., a second electrode) of the storage capacitor Cst may be connected to the driving voltage line PL. Any one electrode (e.g., a first electrode) of the storage capacitor Cst may be connected to the gate electrode of the driving thin-film transistor TFT1, the drain electrode of the compensation thin-film transistor T3, and the source electrode of the first initialization thin-film transistor T4.

An opposite electrode (e.g., a cathode) of the organic light-emitting diode OLED is supplied with a common power supply voltage ELVSS. The organic light-emitting diode OLED may receive a driving current from the driving thin-film transistor TFT1 (e.g., from the driving thin-film transistor TFT1 through the emission control thin-film transistor T6) to emit light.

The pixel circuit PC is not limited to the circuit design and the number of TFTs and storage capacitors described with reference to FIGS. 2A and 2B, and the circuit design and the number of TFTs and storage capacitors may vary according to any suitable design and number of TFTs and storage capacitors. The pixel circuit PC may further include a bias electrode arranged under the thin-film transistors and connected to the thin-film transistors.

Referring to FIG. 2C, each sub-pixel PX may include the organic light-emitting diode OLED and the pixel circuit PC including a plurality of thin-film transistors to drive the organic light-emitting diode OLED. The pixel circuit PC may include the driving thin-film transistor TFT1, the switching thin-film transistor TFT2, a sensing thin-film transistor T3' and the storage capacitor Cst.

The scan line SL may be connected to a gate electrode G2 of the switching thin-film transistor TFT2, and the data line DL may be connected to a source electrode S2 of the switching thin-film transistor TFT2. A first electrode CE1 of the storage capacitor Cst may be connected to a drain electrode D2 of the switching thin-film transistor TFT2.

Accordingly, the switching thin-film transistor TFT2 supplies a data voltage Dm of the data line DL to a first node N in response to the scan signal Sn from the scan line SL of each sub-pixel PX.

A gate electrode G1 of the driving thin-film transistor TFT1 may be connected to the first node N, a source electrode S1 of the driving thin-film transistor TFT1 may be connected to a first power line PL1 that is configured to transmit the driving power voltage ELVDD, and a drain electrode D1 of the driving thin-film transistor TFT1 may be connected to an anode electrode of the organic light-emitting diode OLED.

Accordingly, the driving thin-film transistor TFT1 may adjust the amount of current to flow through in the organic light-emitting diode OLED according to its source-gate voltage Vgs. The source gate voltage Vgs of the driving thin-film transistor TFT1 may be the voltage applied between the driving power supply voltage ELVDD and the first node N.

A sensing control line SSL is connected to a gate electrode G3 of the sensing thin-film transistor T3', a source electrode S3 of the sensing thin-film transistor T3' is connected to a second node S, and a drain electrode D3 of the sensing thin-film transistor T3' is connected to a reference voltage line RL. In some embodiments, the sensing thin-film transistor T3' may be controlled by the scan line SL instead of the sensing control line SSL.

The sensing thin-film transistor T3' may sense a potential of an anode electrode AD of the organic light-emitting diode OLED. The sensing thin-film transistor T3' supplies a pre-charging voltage from the reference voltage line RL to the second node S in response to a sensing signal SSn received from the sensing control line SSL, or supplies a voltage of the anode electrode AD of the organic light-emitting diode OLED to the reference voltage line RL during the sensing (e.g., when the pixel is utilized to sense light, sound, the touch of a user, etc.).

In the storage capacitor Cst, the first electrode CE1 is connected to the first node N, and a second electrode CE2 is connected to the second node S. The storage capacitor Cst charges a difference voltage between voltages respectively supplied to the first and second nodes N and S and supplies the difference voltage as a driving voltage of the driving thin-film transistor TFT1. For example, the storage capacitor Cst may charge a difference voltage between a data voltage Dm and a pre-charging voltage Vpre respectively supplied to the first and second nodes N and S.

A bias electrode BSM may be formed to correspond to the driving thin-film transistor TFT1 and may be connected to the source electrode S3 of the sensing thin-film transistor T3'. Because the bias electrode BSM receives a voltage in association with a potential of the source electrode S3 of the sensing thin-film transistor T3', the driving thin-film transistor TFT1 may be stabilized. In some embodiments, the bias electrode BSM is not connected to the source electrode S3 of the sensing thin-film transistor T3' and may be connected to a separate bias line.

An opposite electrode (e.g., a cathode) of the organic light-emitting diode OLED is supplied with the common power supply voltage ELVSS. The organic light-emitting diode OLED receives a driving current from the driving thin-film transistor TFT1 to emit light.

Although FIG. 2C shows a case where the signal lines SL, SSL, and DL, the reference voltage line RL, the first power line PL1, and a second power line PL2 are provided for each sub-pixel, the disclosure is not limited thereto. For example, at least one of the signal lines SL, SSL, and DL, the reference voltage line RL, the first power line PL1, and/or the second power line PL2 may be shared by neighboring pixels.

Figure 3:
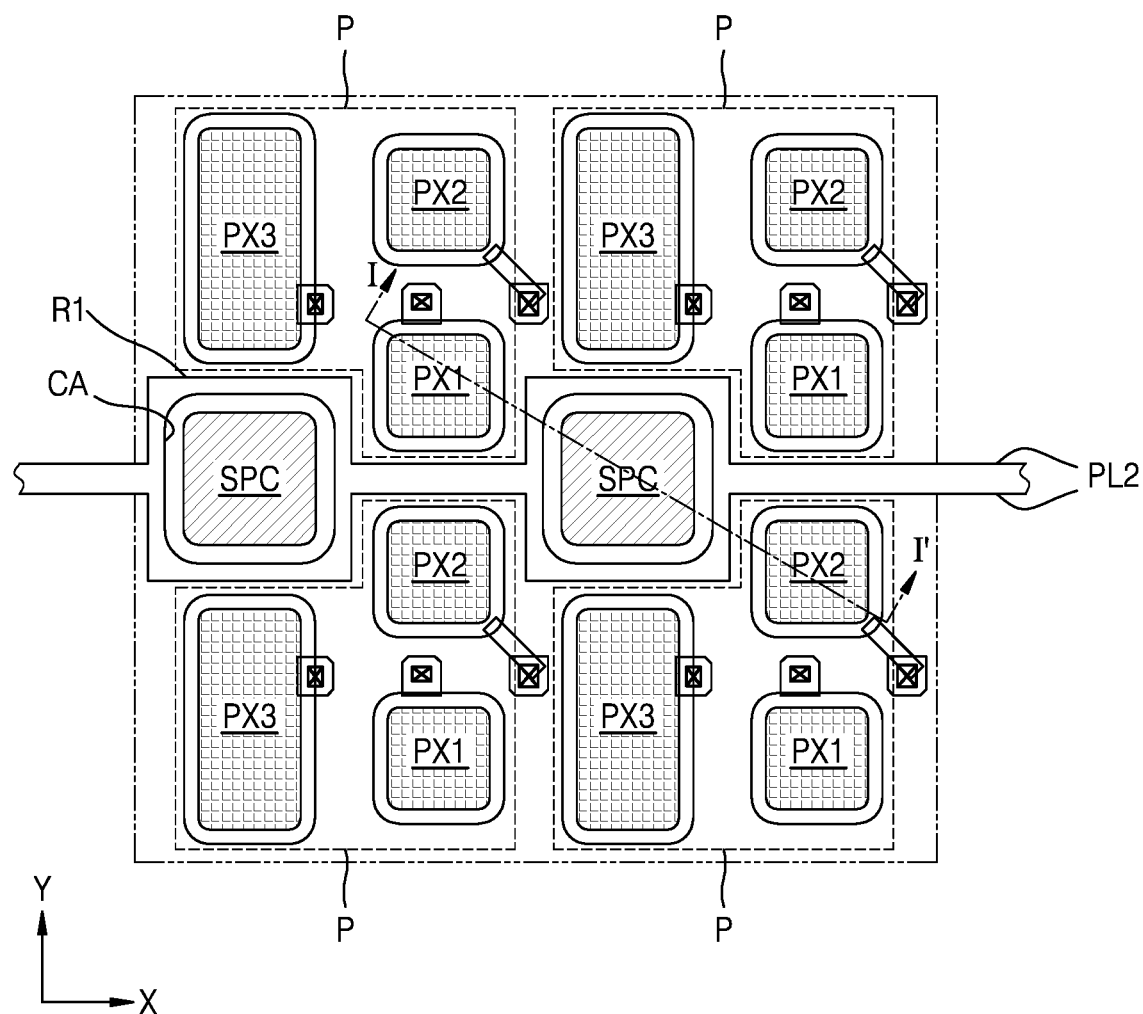
FIG. 3 is a plan view of a portion of a display area according to an embodiment.
Figure 4:
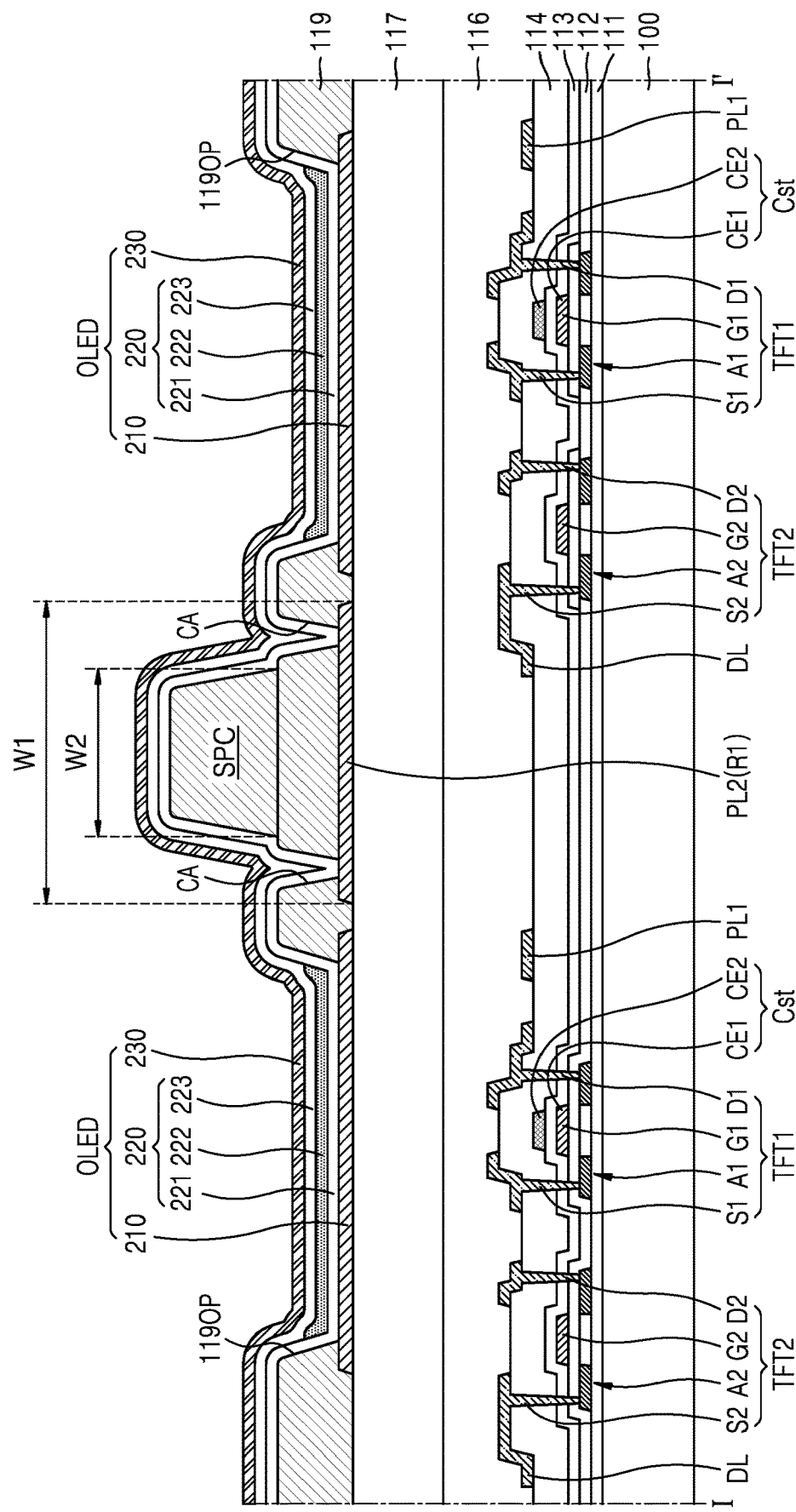
FIG. 4 is a cross-sectional view of the display area taken along line I-I' of FIG. 3.
Figure 5:
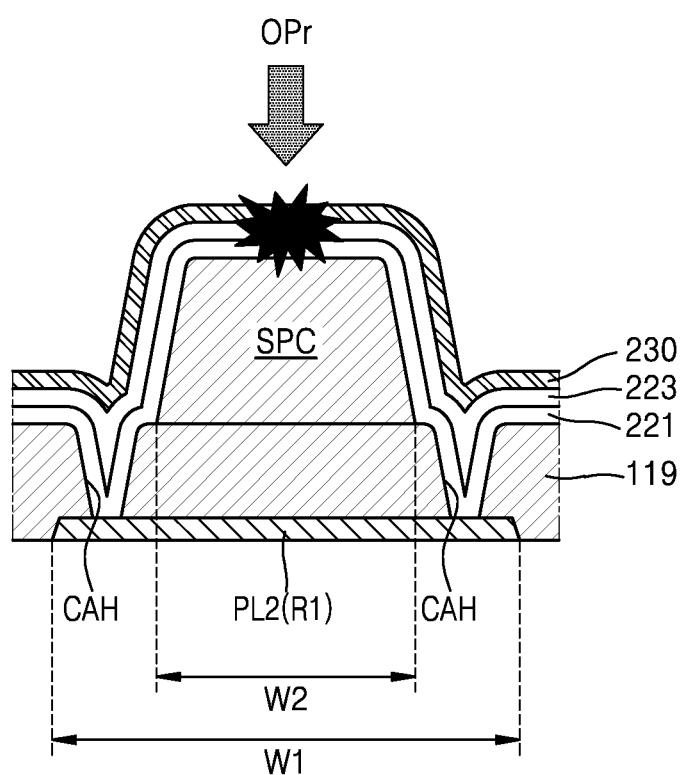
FIG. 5 is an enlarged cross-sectional view of a spacer of FIG. 4.

FIG. 3 is a plan view of a portion of the display area DA according to an embodiment; and FIG. 4 is a cross-sectional view of the display area DA taken along line I-I' of FIG. 3. FIG. 5 is an enlarged cross-sectional view of a spacer SPC of FIG. 4.

Referring to FIG. 3, the organic light-emitting display apparatus according to the present embodiment includes the plurality of sub-pixels PX, and includes the spacer SPC between the plurality of sub-pixels PX. The second power line PL2 to provide the common power voltage ELVSS is under the spacer SPC, and a contact area CA exposing a portion of the second power line PL2 is provided around the spacer SPC. A common layer and an opposite electrode, which will be described in more detail herein below, may be connected to the second power line PL2 through the contact area CA. The second power line PL2 may include a first area R1 corresponding to a lower portion of the spacer SPC (e.g., to a portion of the second power line PL2 under the Spacer SPC), and an area of the first area R1 may be greater than that of the spacer SPC (e.g., when viewed from a plan view). In FIG. 3, the second power line PL2 extends in a first direction (X-direction), but in another embodiment, the second power line PL2 may extend in a second direction (Y-direction). In some embodiments, the contact area CA may be formed to surround the spacer SPC. In some embodiments, a pixel defining layer may have a hole, a plurality of holes, a trench, etc. that exposes the second power line PL2, or a conductive layer, and that defines the contact area CA.

A pixel P may include a first sub-pixel PX1, a second sub-pixel PX2, and a third sub-pixel PX3. The first sub-pixel PX1, the second sub-pixel PX2, and the third sub-pixel PX3 may emit light of different colors. For example, the first sub-pixel PX1, the second sub-pixel PX2, and the third sub-pixel PX3 may emit red light, green light, and blue light, respectively.

As shown in FIG. 3, the first sub-pixel PX1, the second sub-pixel PX2, and the third sub-pixel PX3 may be arranged in an S-stripe structure (e.g., pattern). For example, the third sub-pixel PX3 extends in the second direction (Y direction), and the first sub-pixel PX1 and the second sub-pixel PX2 may be arranged next to one third sub-pixel PX3. Third sub-pixels PX3 may be arranged in a line in the second direction (Y direction). The first sub-pixel PX1 and the second sub-pixel PX2 may be alternately arranged in the second direction (Y direction). In this case, the spacer SPC may be between the third sub-pixels PX3 arranged in the second direction (Y direction).

In FIG. 3, the arrangement of sub-pixels is illustrated as having an S-stripe structure (e.g., pattern), but the disclosure is not limited thereto. For example, the arrangement of sub-pixels may have various suitable arrangement structures (e.g., arrangement patterns) such as a stripe structure, a pentile structure, and a mosaic structure.

Hereinafter, a stacked structure according to an embodiment will be described with reference to FIG. 4.

A buffer layer 111 may be on a substrate 100. The buffer layer 111 may reduce or block the penetration of foreign materials, moisture, and/or external air from a lower portion of the substrate 100 and may provide a flat surface on the substrate 100. The buffer layer 111 may include (e.g., be) an inorganic material, such as an oxide or nitride, an organic material, and/or an organic-inorganic composite material. The buffer layer 111 may have a single layer structure or a multi-layered structure including an inorganic material and/or an organic material. A barrier layer may be between the substrate 100 and the buffer layer 111 to block or reduce penetration of outside air.

A first thin-film transistor TFT1 may include a first semiconductor layer A1, a first gate electrode G1, a first source electrode S1, and a first drain electrode D1. A second thin-film transistor TFT2 may include a second semiconductor layer A2, a second gate electrode G2, a second source electrode S2, and a second drain electrode D2. The first thin-film transistor TFT1 may function as a driving thin-film transistor connected to the organic light-emitting diode OLED to drive the organic light-emitting diode OLED. The second thin-film transistor TFT2 may be connected to the data line DL to function as a switching thin-film transistor. Although two thin-film transistors are shown in drawings, the present disclosure is not limited thereto. The number of thin-film transistors may be variously and suitably changed from two to seven. For example, in some embodiments, the number of thin-film transistors may be within the range of two to seven.

The first semiconductor layer A1 and the second semiconductor layer A2 may each include (e.g., be) amorphous silicon and/or polycrystalline silicon. In another embodiment, the semiconductor layers A1 and A2 may each include (e.g., be) an oxide of at least one material selected from indium (In), gallium (Ga), tin (Sn), zirconium (Zr), vanadium (V), hafnium (Hf), cadmium (Cd), germanium (Ge), chromium (Cr), titanium (Ti), and zinc (Zn). Each of the semiconductor layers A1 and A2 may include a channel region, and source and drain regions that are doped with impurities.

The first gate electrode G1 and the second gate electrode G2 may be on the first semiconductor layer A1 and the second semiconductor layer A2, respectively, with a first gate insulating layer 112 therebetween. Each of the first gate electrode G1 and the second gate electrode G2 may include (e.g., be) molybdenum (Mo), aluminum (Al), copper (Cu), and/or Ti and may be formed as a single layer or as a multi-layer. For example, each of the first gate electrode G1 and the second gate electrode G2 may be a single layer of Mo.

The first gate insulating layer 112 may include (e.g., be) silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), and/or zinc oxide ($ZnO_2$).

A second gate insulating layer 113 may be provided to cover the first gate electrode G1 and the second gate electrode G2. The second gate insulating layer 113 may include (e.g., be) $SiO_2$, $SiN_x$, SiON, $Al_2O_3$, $TiO_2$, $Ta_2O_5$, $HfO_2$, and/or $ZnO_2$.

The first electrode CE1 of the storage capacitor Cst may overlap the first thin-film transistor TFT1. For example, the first gate electrode G1 of the first thin-film transistor TFT1 may serve as the first electrode CE1 of the storage capacitor Cst.

The second electrode CE2 of the storage capacitor Cst overlaps the first electrode CE1 with the second gate insulating layer 113 therebetween. In some embodiments, the second gate insulating layer 113 may serve as a dielectric layer of the storage capacitor Cst. The second electrode CE2 may include (e.g., be) a conductive material including Mo, Al, Cu, Ti, and/or the like and may be formed as a single layer or as multiple layers including (e.g., being) the above materials (e.g., Mo, Al, Cu, Ti, and/or the like). For example, the second electrode CE2 may be a single layer of Mo or multiple layers of Mo/Al/Mo.

The first source electrode S1 and the first drain electrode D1, and the second source electrode S2 and the second drain electrode D2 may be on an interlayer insulating layer 114. The interlayer insulating layer 114 may be on a second gate insulating layer 113 and on the second electrode CE2 of the storage capacitor Cst.

The interlayer insulating layer 114 may include (e.g., be) $SiO_2$, $SiN_x$, SiON, $Al_2O_3$, $TiO_2$, $Ta_2O_5$, $HfO_2$, and/or $ZnO_2$.

The first source electrode S1 and the first drain electrode D1, and the second source electrode S2 and the second drain electrode D2 may include (e.g., be) a conductive material including Mo, Al, Cu, Ti, and/or the like, and may be formed as a single layer or as multiple layers including the above-described materials (e.g., Mo, Al, Cu, Ti, and/or the like). For example, the first source electrode S1 and the first drain electrode D1, and the second source electrode S2 and the second drain electrode D2 may have a multi-layered structure of Ti/Al/Ti.

A first planarization layer 116 may be on the first source electrode S1 and the first drain electrode D1, and the second source electrode S2 and the second drain electrode D2. The organic light-emitting diode OLED may be on the first planarization layer 116. In some embodiments, a second planarization layer 117 may be on the first planarization layer 116 and the organic light emitting diode OLED may be on the second planarization layer 117.

The first planarization layer 116 may have a flat top surface so that a pixel electrode 210 may be formed flat. The first planarization layer 116 may include (e.g., be) organic materials and may be formed as a single layer or as multiple layers. The first planarization layer 116 may include (e.g., be) a general polymer such as benzocyclobutene (BCB), polyimide, polymethylmethacrylate (PMMA), and/or polystyrene (PS), and/or a polymer derivative including a phenolic group, an acrylic polymer, an imide polymer, an aryl ether polymer, an amide polymer, a fluorine-based polymer, a p-xylene-based polymer, a vinyl alcohol polymer, and/or a blend thereof.

The organic light-emitting diode OLED is on the first planarization layer 116. The organic light-emitting diode OLED includes the pixel electrode 210, an intermediate layer 220 including an organic light-emitting layer 222, and an opposite electrode 230.

The first planarization layer 116 has a via hole exposing any one of the first source electrode S1 and the first drain electrode D1 of the first thin-film transistor TFT1, and the pixel electrode 210 may contact the first source electrode S1 or the first drain electrode D1 through the via hole to be electrically connected to the first thin-film transistor TFT1.

The pixel electrode 210 may be a transmissive electrode or a reflective electrode. In some embodiments, the pixel electrode 210 may include a reflective film formed of silver (Ag), magnesium (Mg), aluminum (Al), platinum (Pt), palladium (Pd), gold (Au), nickel (Ni), neodymium (Nd), iridium (Ir), chromium (Cr), and/or a compound thereof, and a transparent or semi-transparent electrode layer formed above the reflective film. The transparent or semi-transparent electrode layer may include (e.g., be) at least one of indium tin oxide (ITO), indium zinc oxide (IZO), zinc oxide (ZnO), indium oxide ($In_2O_3$), indium gallium oxide (IGO), and/or aluminum zinc oxide (AZO).

A pixel-defining layer 119 may be on the first planarization layer 116. The pixel-defining layer 119 may define a light-emitting area of pixels by having an opening 119OP corresponding to each of sub pixels. For example, the opening 119OP may expose at least a center portion of the pixel electrode 210. Furthermore, the pixel-defining layer 119 may prevent or reduce the occurrence of generation of an arc on edges of the pixel electrode 210 by increasing a distance between the edges of the pixel electrode 210 and the opposite electrode 230 above the pixel electrode 210. The pixel-defining layer 119 may include (e.g., be) at least one organic insulating material selected from among polyimide, polyamide, acrylic resin, BCB, and phenolic resin, and may be formed by spin coating or the like.

The spacer SPC may be on the pixel-defining layer 119. The spacer SPC may be between a plurality of display elements. For example, the spacer SPC may be between the first sub-pixel PX1 and the second sub-pixel PX2. The spacer SPC may protrude in a direction away from the substrate 100 on the pixel-defining layer 119. For example, in an embodiment, the spacer SPC may be on the pixel-defining layer 119 and may protrude away from the substrate 100 and from the pixel-defining layer 119.

The spacer SPC may be a component to prevent or reduce stamping during a mask process. The spacer SPC may support a sealing substrate when the spacer SPC is sealed with the sealing substrate. In an embodiment, the spacer SPC may be configured to protect the organic light-emitting diode OLED, etc. when external pressure is applied to an organic light-emitting display apparatus. In another embodiment, the spacer SPC may change an optical path. For example, in an embodiment, the spacer SPC may be configured to change an optical path of light emitted from the organic light-emitting diode OLED.

The spacer SPC may include (e.g., be) at least one organic insulating material selected from among polyimide, polyamide, acrylic resin, BCB, and phenolic resin, and may be formed by spin coating or the like. In some embodiments, the spacer SPC may be concurrently (e.g., simultaneously) formed of the same material as that of the pixel-defining layer 119 by a process utilizing a halftone mask. For example, in an embodiment, the spacer SPC and the pixel-defining layer 119 may be concurrently (e.g., simultaneously) formed with the same material and by a process utilizing a halftone mask.

The intermediate layer 220 of the organic light-emitting diode OLED may include an organic light-emitting layer 222. The organic light-emitting layer 222 may include (e.g., be) an organic material including a fluorescent and/or phosphorescent material to emit red, green, blue, or white light. The intermediate layer 220 may include a first common layer 221 below the organic light-emitting layer 222 and/or a second common layer 223 on the organic light-emitting layer 222.

The first common layer 221 may be a single layer or multiple layers. For example, when the first common layer 221 includes (e.g., is) a polymer material, the first common layer 221 may be a hole transport layer (HTL) having a single-layer structure and may include (e.g., be) 3,4-ethylene-dihydroxythiophene (PEDOT) and/or polyaniline (PANI). When the first common layer 221 includes a low molecular weight material, the first common layer 221 may include a hole injection layer (HIL) and the HTL.

The second common layer 223 is optional. For example, when the first common layer 221 and the organic light-emitting layer 222 include (e.g., are) a polymer material, the second common layer 223 may be formed (e.g., may be included). The second common layer 223 may be a single layer or multiple layers. The second common layer 223 may include an electron transport layer (ETL) and/or an electron injection layer (EIL).

The organic light-emitting layer 222 of the intermediate layer 220 may be arranged for each sub-pixel in a display area. For example, in some embodiments, the organic light-emitting layer 222 may be provided in plurality, and each portion of the organic light-emitting layer 222 may correspond to a sub-pixel. The organic light-emitting layer 222 may be arranged to overlap the opening 119OP of the pixel-defining layer 119 and/or the pixel electrode 210. The first and second common layers 221 and 223 of the intermediate layer 220 may be formed as a single body. The first and second common layers 221 and 223 may be arranged on (e.g., cover) the spacer SPC and may be in a portion of a peripheral area.

The opposite electrode 230 may be integrally formed with a plurality of organic light-emitting diodes to correspond to a plurality of pixel electrodes 210. The opposite electrode 230 may include (e.g., be) a conductive material having a low work function. For example, the opposite electrode 230 may include (e.g., be) a transparent or semi-transparent layer including Ag, Mg, Al, Pt, Pd, Au, Ni, Nd, Ir, Cr, lithium (Li), calcium (Ca), and/or an alloy thereof. In an embodiment, the opposite electrode 230 may further include a layer such as ITO, IZO, ZnO, or $In_2O_3$ on the transparent or semi-transparent layer including the above-mentioned material.

A capping layer to increase light extraction efficiency and/or an LiF layer to protect the opposite electrode 230 and the like from a subsequent process may be further arranged on the opposite electrode 230.

In the present embodiment, the second power line PL2 may be provided below the spacer SPC to provide the common power supply voltage ELVSS so as to overlap the spacer SPC, and the contact area CA exposing the second power line PL2 may be provided around the spacer SPC. The contact area CA may be provided as a hole passing through the pixel-defining layer 119.

In the present embodiment, the second power line PL2 may be apart (e.g., spaced apart) from the pixel electrode 210 and may be on the same layer as the pixel electrode 210. The second power line PL2 may be formed of the same material as that of the pixel electrode 210 and may be formed at the same time. For example, the second power line PL2 may include (e.g., be) a reflective film formed of Ag, Mg, Al, Pt, Pd, Au, Ni, Nd, Ir, Cr, and/or a compound thereof, and a transparent or semi-transparent electrode layer may be formed on the reflective film. The transparent or semi-transparent electrode layer may include (e.g., be) at least one selected from ITO, IZO, ZnO, $In_2O_3$, IGO, and AZO.

The second power line PL2 may be formed to overlap the spacer SPC, and an area of the first area R1 corresponding to the spacer SPC may be greater than that of the spacer SPC. For example, a width W1 of the first area R1 of the second power line PL2 may be greater than a width W2 of the spacer SPC.

The first common layer 221, the second common layer 223, and/or the opposite electrode 230 may be inserted into the contact area CA to be connected to the second power line PL2.

Referring to FIG. 5, because the spacer SPC protrudes from (e.g., protrudes away from) an upper surface of the substrate, the spacer SPC may be vulnerable to external pressure. When external pressure OPr is applied on an upper portion of the spacer SPC, pressure may be applied to the first common layer 221 and/or the second common layer 223 to prevent or reduce the flow of current to (e.g., over, across, etc.) the upper portion of the spacer SPC.

When the contact area CA is not formed around the spacer SPC, resistance may be increased in the first common layer 221 and/or the second common layer 223 by the external pressure OPr. As a result, luminance of the adjacent organic light-emitting diode OLED may be reduced.

In the present embodiment, the contact area CA, in which the first common layer 221 and the second power line PL2 are connected to each other, may be formed around the spacer SPC to form a current path CP below the spacer SPC. Accordingly, even if the external pressure OPr acts on the spacer SPC, the luminance of the organic light-emitting diode OLED may not be reduced.

As shown in FIG. 3, in some embodiments, the contact area CA may be provided as one hole to surround the spacer SPC.

Figure 6A:
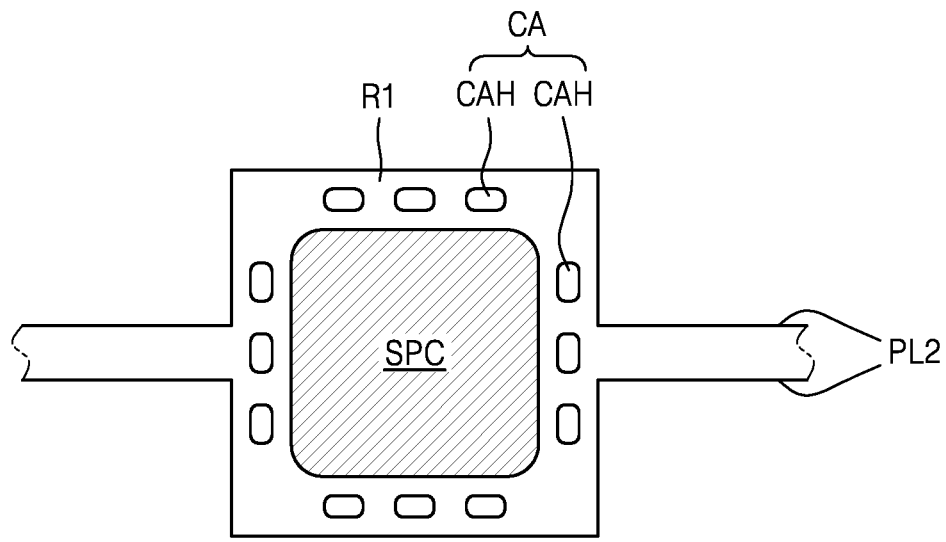
FIGS. 6A and 6B are each a plan view of a spacer area according to an embodiment.
Figure 6B:
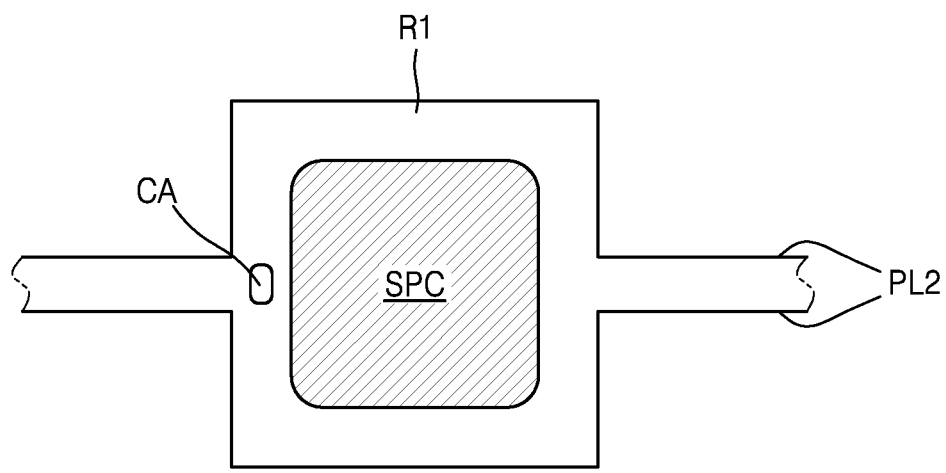

In another embodiment, as shown in FIG. 6A, the contact area CA may include a plurality of contact holes CAH, such that the plurality of contact holes CAH surround the spacer SPC. In another embodiment, as shown in FIG. 6B, the contact area CA may be arranged on only one side of the spacer SPC without surrounding the spacer SPC.

Figure 7A:
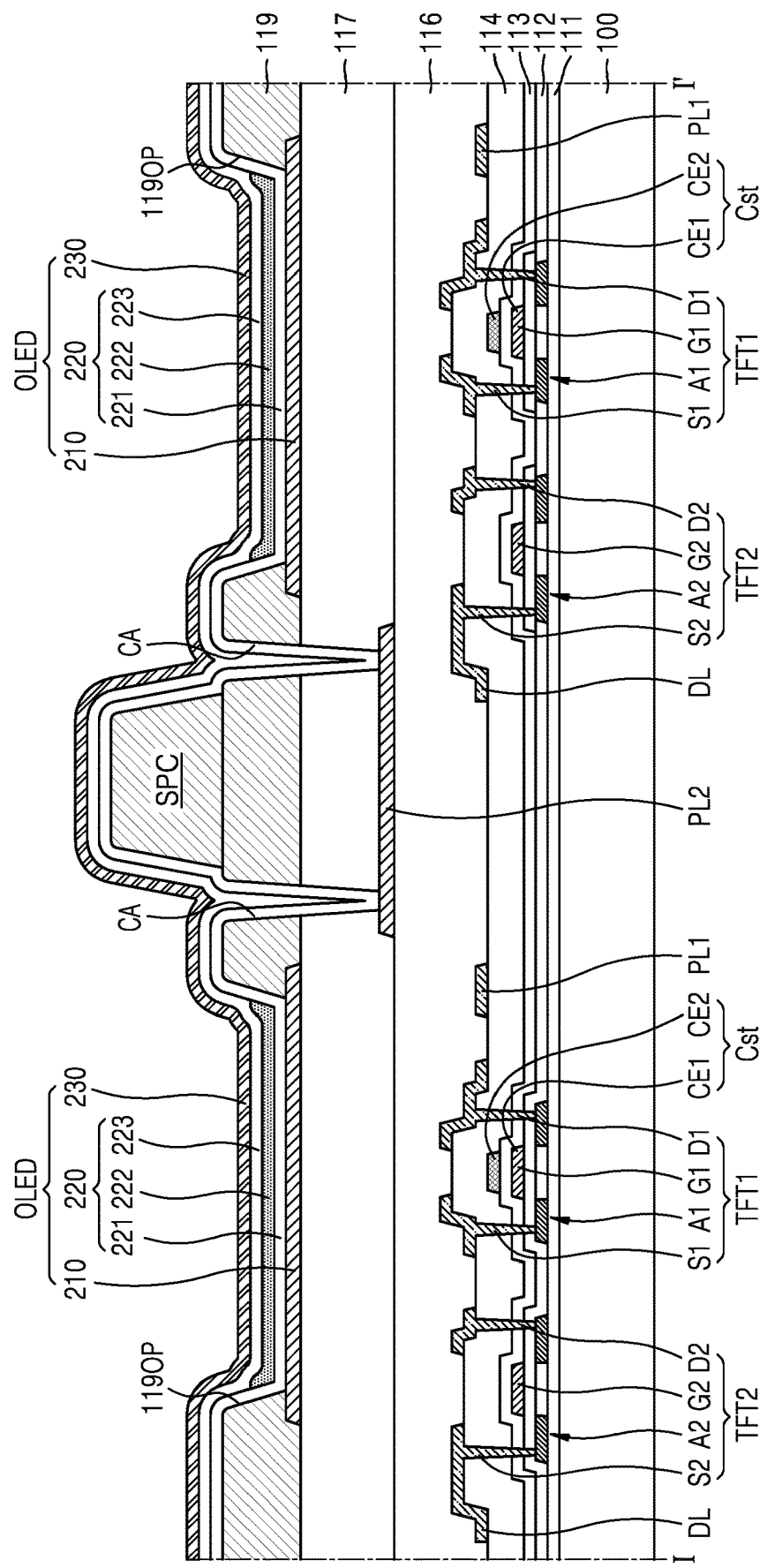
FIG. 7A is a cross-sectional view of an organic light-emitting display apparatus according to another embodiment.

FIG. 7A is a cross-sectional view of an organic light-emitting display apparatus according to another embodiment. In FIG. 7A, the same reference numerals as those in FIG. 4 denote the same elements, and a duplicate description will not be repeated.

Referring to FIG. 7A, the organic light-emitting display apparatus according to an embodiment includes the substrate 100, a plurality of organic light-emitting diodes OLED, the spacer SPC, the second power line PL2 that is a line overlapping the spacer SPC, and the contact area CA in which the first common layer 221 of the light-emitting diode OLED and the second power line PL2 are connected to each other.

The organic light-emitting display apparatus may further include a second planarization layer 117 on the first planarization layer 116. Accordingly, the second power line PL2 may be between the first planarization layer 116 and the second planarization layer 117. In some embodiments, the second planarization layer 117 is between the first planarization layer 116 and the organic light-emitting diode OLED.

The second power line PL2 may include (e.g., be) a conductive material including Mo, Al, Cu, Ti, and/or the like, and may be formed as a single layer or multiple layers including (e.g., being) the above-mentioned material (e.g., Mo, Al, Cu, Ti, and/or the like). For example, the second power line PL2 may have a multi-layered structure of Ti/Al/Ti.

The second planarization layer 117 may have a flat top surface so that the pixel electrode 210 may be formed flat. The second planarization layer 117 may include (e.g., be) organic materials and may be formed as a single layer or as multiple layers. The second planarization layer 117 may include (e.g., be) a general polymer such as BCB, polyimide, PMMA, and/or PS, and/or a polymer derivative including a phenolic group, an acrylic polymer, an imide polymer, an aryl ether polymer, an amide polymer, a fluorine-based polymer, a p-xylene-based polymer, a vinyl alcohol polymer, and/or a blend (e.g., combination) thereof.

The organic light-emitting diode OLED is on the second planarization layer 117. The pixel electrode 210 of the organic light-emitting diode OLED may be connected to the first thin-film transistor TFT1 through a connection electrode on the first planarization layer 116.

In the present embodiment, because the second power line PL2 is arranged on a different layer than the pixel electrode 210, a portion of the second power line PL2 may overlap the pixel electrode 210.

The contact area CA may include (e.g., be) a hole passing through the pixel-defining layer 119 and the second planarization layer 117 and may be formed to expose the second power line PL2. The first common layer 221, the second common layer 223, and/or the opposite electrode 230 may be inserted into the contact area CA to be connected to the second power line PL2. Accordingly, when external pressure is applied to the spacer SPC, a current path may be formed below the spacer SPC.

Figure 7B:
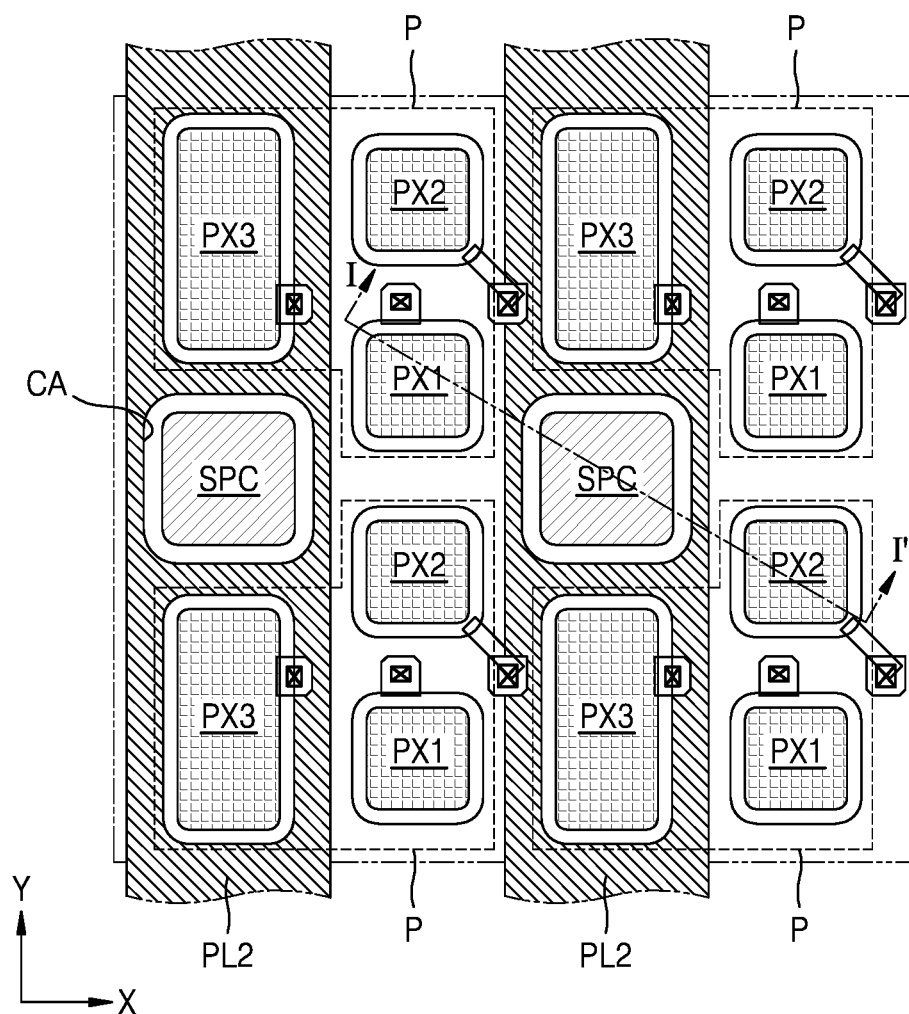
FIG. 7B is a plan view of a portion of a display area according to another embodiment.

FIG. 7B is a plan view of a portion of a display area according to another embodiment. In FIG. 7B, the same reference numerals as those in FIG. 3 denote the same elements, and a duplicate description will not be repeated.

Referring to FIG. 7B, when the second power line PL2 is arranged on a different layer than the pixel electrode 210 as shown in FIG. 7A, because the second power line PL2 may be arranged to overlap the pixel electrode 210, the second power line PL2 may be provided to have a certain width greater than that of the spacer SPC. In addition, the second power line PL2 may extend in various suitable directions. In some embodiments, the second power line PL2 may extend in the second direction (Y direction) as shown in FIG. 7B. In another embodiment, the second power line PL2 may extend in the first direction (X direction). In another embodiment, the second power line PL2 may be provided in a mesh structure (e.g., a mesh shape or pattern) in which lines extending in the first direction (X direction) and the second direction (Y direction) are connected to (e.g., cross or intersect) each other.

Figure 8:
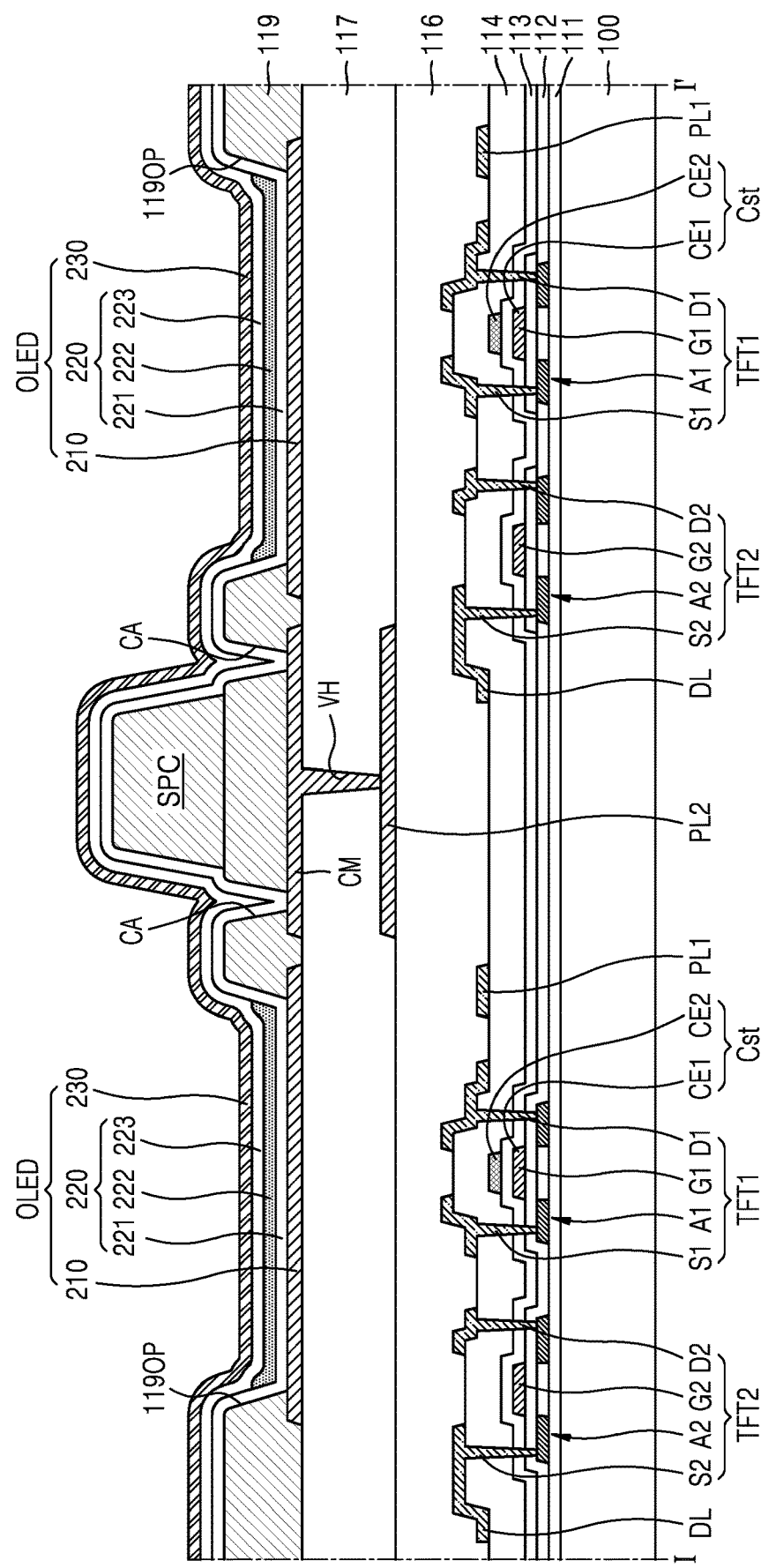
FIG. 8 is a cross-sectional view of an organic light-emitting display apparatus according to another embodiment.
Figure 9:
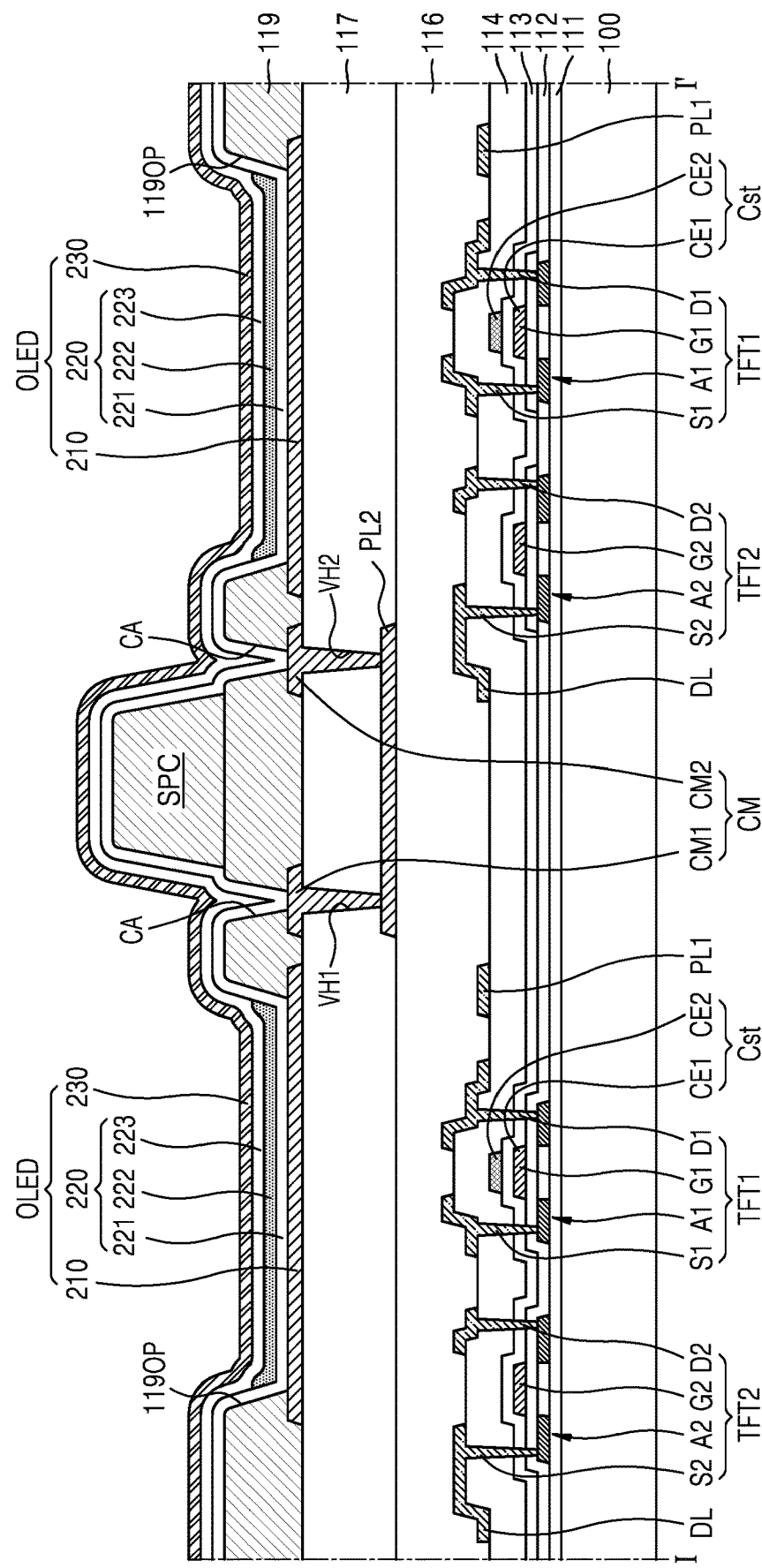
FIG. 9 is a cross-sectional view of an organic light-emitting display apparatus according to another embodiment.
Figure 10:
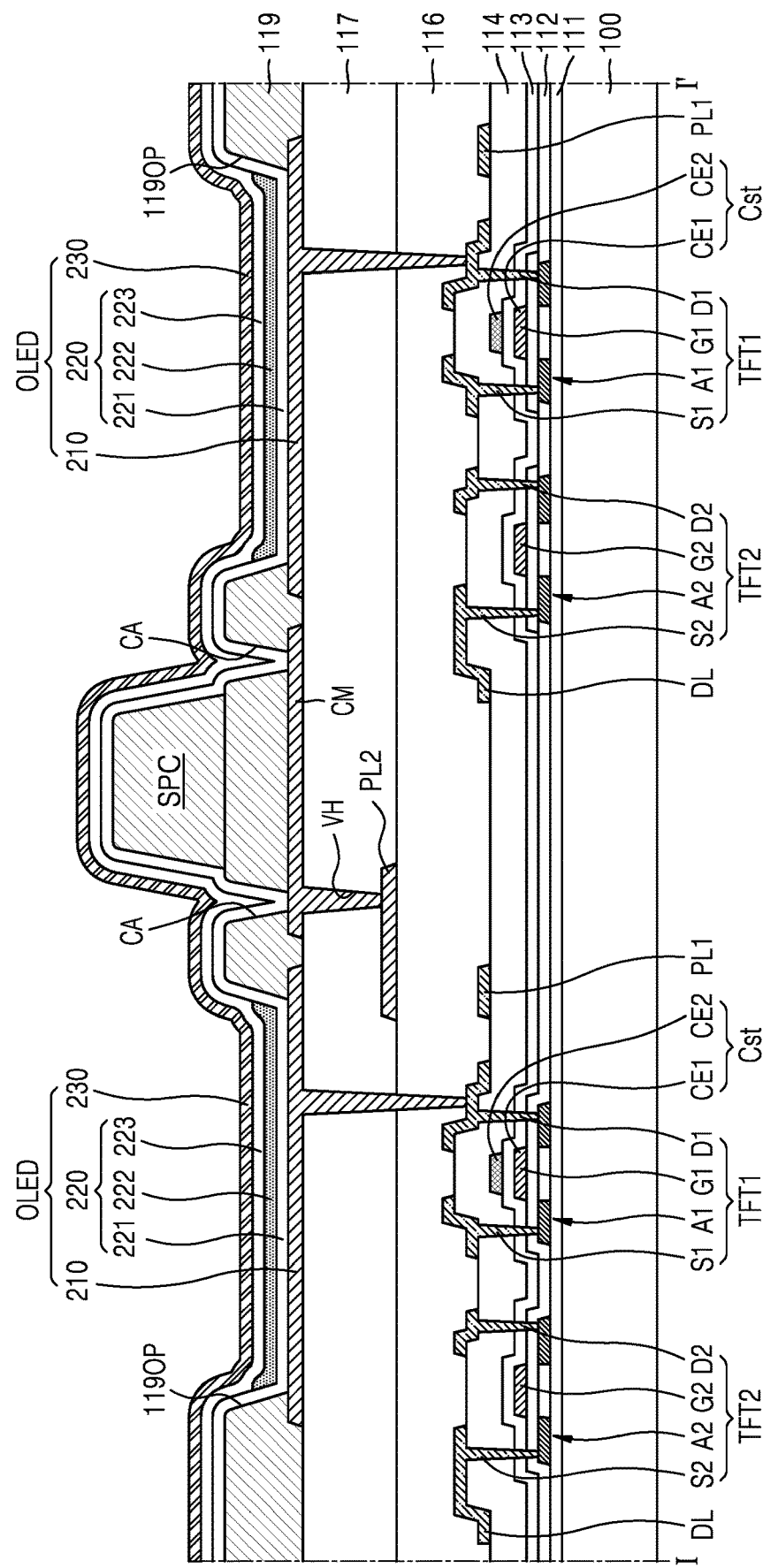
FIG. 10 is a cross-sectional view of an organic light-emitting display apparatus according to another embodiment.

FIGS. 8 to 10 are cross-sectional views of an organic light-emitting display apparatus according to some embodiments. In FIGS. 8 to 10, the same reference numerals as those in FIG. 7A denote the same elements, and duplicate descriptions will not be repeated.

Referring to FIGS. 8 to 10, the organic light-emitting display apparatus according to an embodiment includes the substrate 100, the plurality of organic light-emitting diodes OLED, the spacer SPC, the second power line PL2 that is a line overlapping the spacer SPC, and the contact area CA in which the first common layer 221 of the light-emitting diode OLED and the second power line PL2 are electrically connected to each other.

In the present embodiments, the first common layer 221 and the second power line PL2 may be connected to each other through a connection electrode CM. The connection electrode CM may be provided in (e.g., on) the same layer as that of the pixel electrode 210 and may be formed of the same material as that of the pixel electrode 210. For example, the connection electrode CM may include a reflective film formed of Ag, Mg, Al, Pt, Pd, Au, Ni, Nd, Ir, Cr, and/or a compound thereof, and a transparent or semi-transparent electrode layer formed on the reflective film. The transparent or semi-transparent electrode layer may include (e.g., be) at least one of ITO, IZO, ZnO (e.g., ZnO$_2$), In$_2$O$_3$, IGO, and/or AZO.

In FIG. 8, the contact area CA may be provided as a hole exposing the connection electrode CM. The connection electrode CM may be connected to the second power line PL2 through a via hole VH passing through the second planarization layer 117. The connection electrode CM is arranged to overlap the spacer SPC, and may have an area that is greater than the area of the spacer SPC.

In FIG. 9, a plurality of connection electrodes CM may be provided. For example, the connection electrode CM may include a first connection electrode CM1 and a second connection electrode CM2. The first connection electrode CM1 may be connected to the second power line PL2 through a first via hole VH1 passing through the second planarization layer 117, and the second connection electrode CM2 may be connected to the second power line PL2 through a second via hole VH2 passing through the second planarization layer 117.

Regarding FIG. 10, the second power line PL2 may be arranged to overlap only a portion of the spacer SPC or not overlap the spacer SPC at all. In the present embodiment, because the first common layer 221 of the organic light-emitting diode OLED is electrically connected to the second power line PL2 through the connecting electrode CM, the spacer SPC does not need to overlap the second power line PL2 as a whole. In this case, the degree of freedom in designing the second power line PL2 may be increased.

Figure 11:
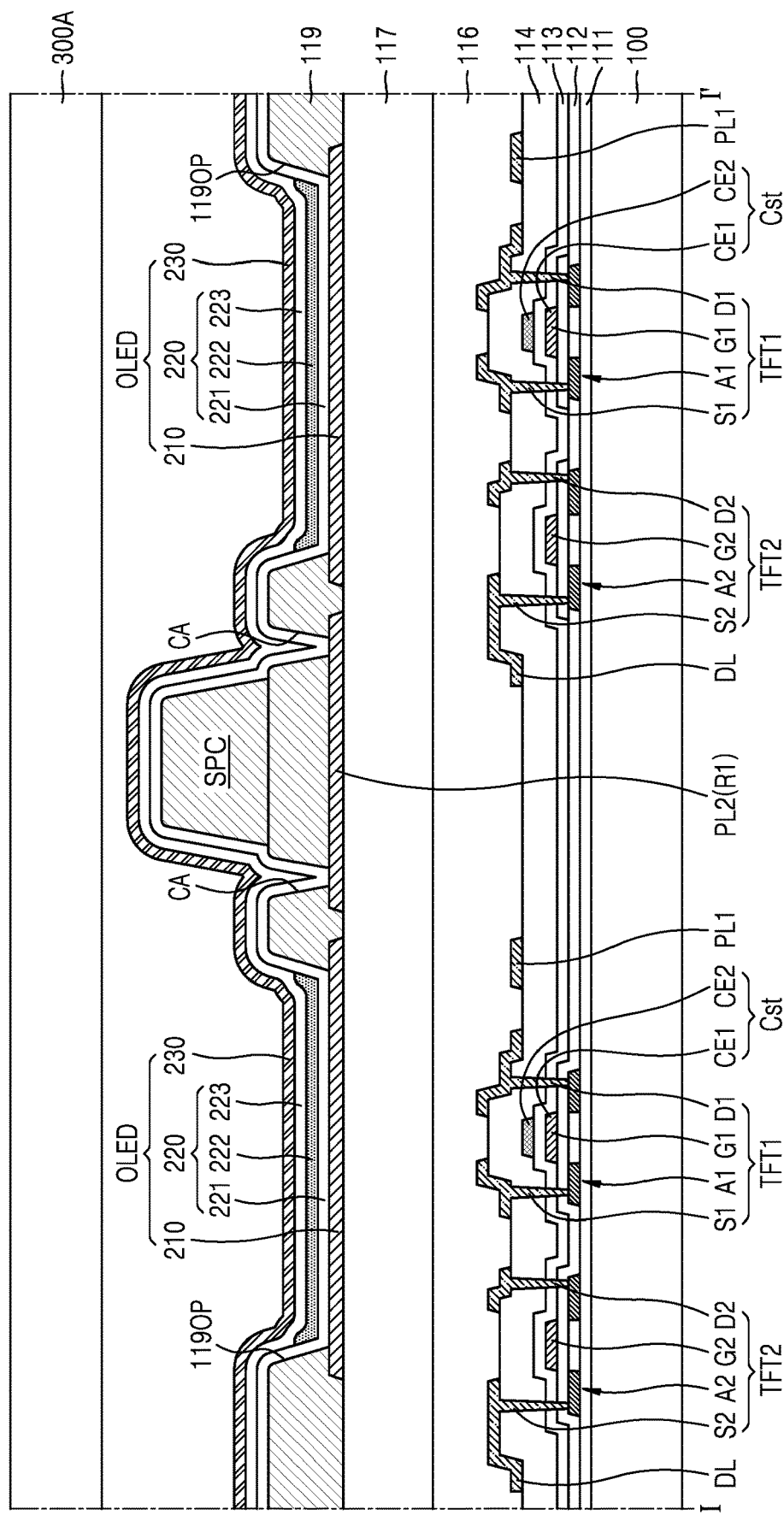
FIG. 11 is a cross-sectional view of an organic light-emitting display apparatus according to another embodiment.

FIG. 11 is a cross-sectional view of an organic light-emitting display apparatus according to another embodiment. In FIG. 11, the same reference numerals as those in FIG. 4 denote the same elements, and a duplicate description thereof will not be repeated here.

Referring to FIG. 11, the organic light-emitting display apparatus may include a sealing substrate 300A, and the plurality of organic light-emitting diodes OLED may be sealed with the sealing substrate 300A.

The sealing substrate 300A is arranged to face the substrate 100, and the sealing substrate 300A and the substrate 100 may be bonded by a sealant arranged to surround the display area DA in the peripheral area PA (see FIG. 1).

The sealant may be an inorganic material. For example, the sealant may be a frit. The sealant may be applied by a dispenser or a screen printing method. A frit generally refers to a glass raw material in powder form, but in the present disclosure, the frit may also refer to a paste state in which a main material, such as SiO$_2$, contains a laser or infrared absorber (e.g., a material that absorbs laser light or infrared light), an organic binder, and a filler for reducing a coefficient of thermal expansion. The frit in the paste state may be cured by removing the organic binder and moisture through a drying or firing process. The laser or infrared absorber may include (e.g., be) a transition metal compound. Laser light may be used as a heat source for curing the sealant and bonding the substrate 100 and the sealing substrate 300A.

As the sealant bonds the substrate 100 and the sealing substrate 300A, the sealant may prevent or reduce the occurrence of oxygen, moisture, and/or the like from flowing into the organic light-emitting diode OLED and may improve mechanical strength.

The sealing substrate 300A may be formed of various suitable materials, such as a glass material, a ceramic material, a plastic material, and/or a metal material, which are transparent and mainly containing SiO$_2$. A touch screen layer, a polarizing layer, and a window may further be arranged on the sealing substrate 300A.

When the sealing substrate 300A is pressed by external pressure, pressure may be applied to the spacer SPC. In this case, a current flow of the first common layer 221 and the second common layer 223 on the spacer SPC may be suppressed (e.g., reduced). In the present embodiment, the contact area CA, in which the first common layer 221 and the second power line PL2 are connected to each other, is provided around the spacer SPC to provide a current path below the spacer SPC. Accordingly, despite the external pressure, a highly reliable organic light-emitting display apparatus may be provided.

Figure 12:
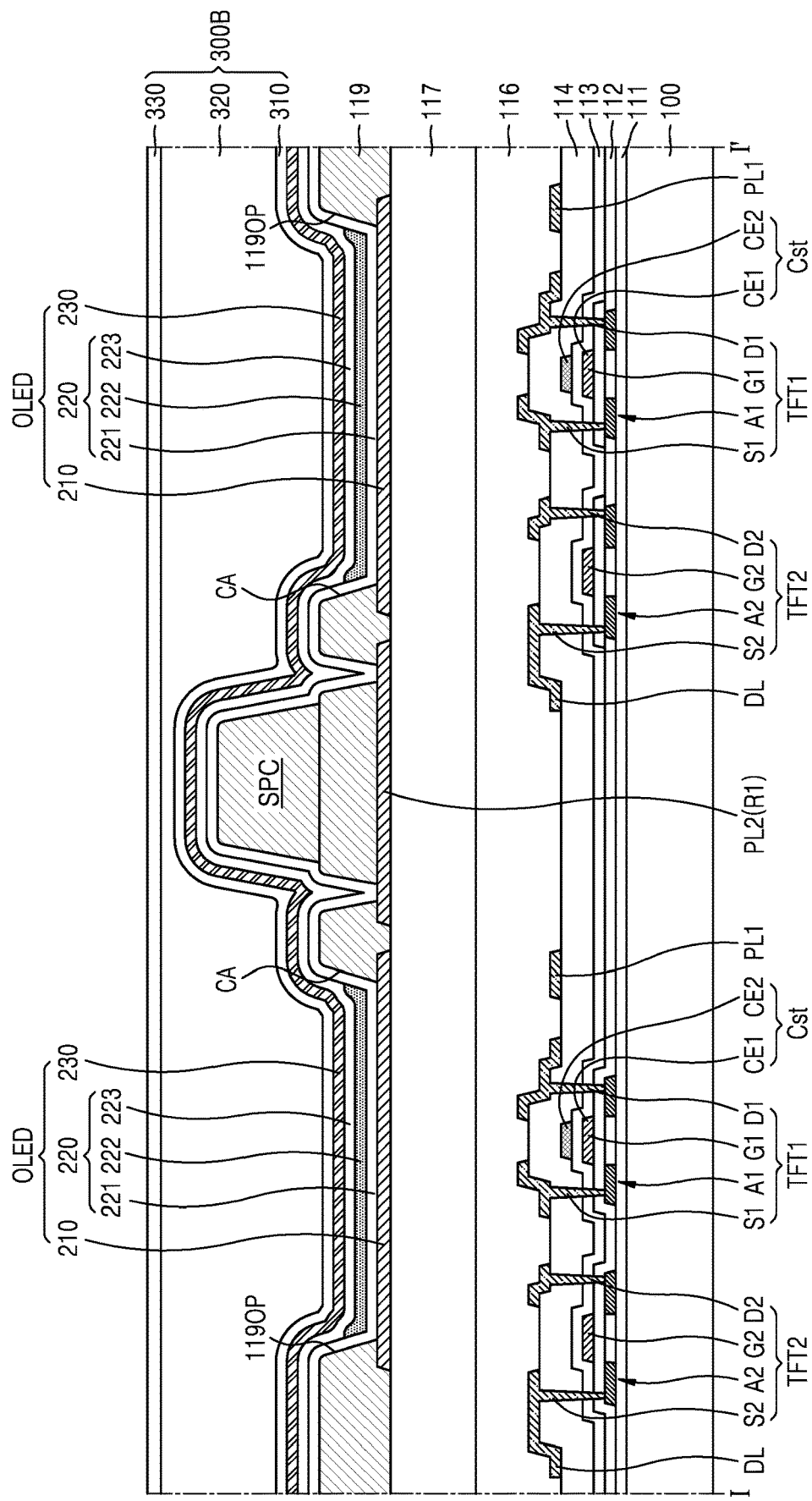
FIG. 12 is a cross-sectional view of an organic light-emitting display apparatus according to another embodiment.

FIG. 12 is a cross-sectional view of an organic light-emitting display apparatus according to another embodiment. In FIG. 12, the same reference numerals as those in FIG. 4 denote the same elements, and a duplicate description thereof will not be repeated here.

Referring to FIG. 12, the organic light-emitting display apparatus may include a thin-film encapsulation layer 300B, and the plurality of organic light-emitting diodes OLED may be sealed with the thin-film encapsulation layer 300B.

The thin-film encapsulation layer 300B may cover the display area DA and extend to the outside of the display area DA. The thin-film encapsulation layer 300B may include at least one organic encapsulation layer and at least one inorganic encapsulation layer. For example, the thin-film encapsulation layer 300B may include a first inorganic encapsulation layer 310, an organic encapsulation layer 320, and a second inorganic encapsulation layer 330.

The first inorganic encapsulation layer 310 covers the opposite electrode 230 and may include (e.g., be) $SiO_2$, $SiN_x$, and/or $SiON_x$. Other layers such as a capping layer may be between the first inorganic encapsulation layer 310 and the opposite electrode 230. A shape of the first inorganic encapsulation layer 310 is formed along (e.g., corresponds to) the shape of a structure therebelow (e.g., of the opposite electrode 230), and thus, an upper surface thereof may not be flat. The organic encapsulation layer 320 covers the first inorganic encapsulation layer 310. However, unlike the first inorganic encapsulation layer 310, an upper surface of the organic encapsulation layer 320 may be formed to be generally or substantially flat. In more detail, the upper surface of the organic encapsulation layer 320 corresponding to the display area DA may be approximately or about flat. The organic encapsulation layer 320 may include (e.g., be) at least one of polyethylene terephthalate, polyethylene naphthalate, polycarbonate, polyimide, polyethylene sulfonate, polyoxymethylene, polyarylate, and/or hexamethyl disiloxane. The second inorganic encapsulation layer 330 covers the organic encapsulation layer 320 and may include (e.g., be) $SiO_x$, $SiN_x$, and/or $SiON_x$.

Even if a crack occurs in the thin-film encapsulation layer 300B through the above-described multi-layered structure, the crack may not be connected between the first inorganic encapsulation layer 310 and the organic encapsulation layer 320, or between the organic encapsulation layer 320 and the second inorganic encapsulation layer 330. In this manner, the formation of a penetration path of external moisture and/or oxygen into the display area DA may be prevented, reduced, or minimized. A touch screen layer, a polarizing layer, and a window may further be arranged on the thin-film encapsulation layer 300B.

So far, embodiments which may be applied to embodiments of the disclosure have been described. These embodiments may be embodied as separate embodiments or combined embodiments.

As described above, an organic light-emitting diode display according to embodiments includes a contact area in which a common layer and a common voltage line are connected to each other around a spacer, thereby reducing or minimizing the influence on the display quality even when external pressure is applied.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various suitable changes in form and details may be made therein without departing from the spirit and scope as defined by the following claims and equivalents thereof.

What is claimed is:

1. An organic light-emitting display apparatus comprising:
   a substrate;
   a plurality of organic light-emitting diodes on the substrate;
   a spacer arranged between the plurality of organic light-emitting diodes and protruding away from an upper surface of the substrate;
   a conductive layer overlapping the spacer;
   a contact area exposing the conductive layer at a side of the spacer; and
   a pixel-defining layer covering an edge of pixel electrodes of the plurality of organic light-emitting diodes and having an opening exposing a center of the pixel electrodes,
   wherein a common layer of the plurality of organic light-emitting diodes and the conductive layer are connected to each other through the contact area,
   wherein the common layer includes at least one of an electron injection layer, an electron transport layer, a hole injection layer, or a hole transport layer, and the at least one of the electron injection layer, the electron transport layer, the hole injection layer, or the hole transport layer is continuously disposed from the contact area to an upper surface of the spacer, and
   wherein the spacer is separated from all the pixel electrodes.

2. The organic light-emitting display apparatus of claim 1, wherein the contact area surrounds the spacer.

3. The organic light-emitting display apparatus of claim 1, wherein the conductive layer is on a same layer as pixel electrodes of the plurality of organic light-emitting diodes and is spaced apart from the pixel electrodes.

4. The organic light-emitting display apparatus of claim 1, wherein the conductive layer is a line for transmitting a common power supply voltage.

5. The organic light-emitting display apparatus of claim 1, wherein an area of the conductive layer corresponding to the spacer is greater than an area of the spacer when viewed from a plan view.

6. The organic light-emitting display apparatus of claim 1, further comprising a first line below the conductive layer,
   wherein the conductive layer is connected to the first line via a via hole.

7. The organic light-emitting display apparatus of claim 6, wherein the first line is configured to transmit a common power supply voltage.

8. The organic light-emitting display apparatus of claim 6,
   wherein the conductive layer comprises a first connection electrode and a second connection electrode, and
   wherein the first connection electrode is connected to the first line through a first via hole, and the second connection electrode is connected to the first line through a second via hole.

9. The organic light-emitting display apparatus of claim 1, further comprising:
   a thin-film transistor on the substrate; and a first planarization layer and a second planarization layer arranged and stacked between the thin-film transistor and the plurality of organic light-emitting diodes, wherein the conductive layer is between the first planarization layer and the second planarization layer.

10. The organic light-emitting display apparatus of claim 1, wherein the contact area comprises a plurality of contact holes that surround the spacer.

11. The organic light-emitting display apparatus of claim 1, wherein the spacer protrudes from an upper surface of the pixel-defining layer.

12. An organic light-emitting display apparatus comprising:

a substrate;

a plurality of organic light-emitting diodes on the substrate;

a spacer arranged between the plurality of organic light-emitting diodes and protruding away from an upper surface of the substrate;

a conductive layer overlapping the spacer; and a contact area exposing the conductive layer at a side of the spacer, wherein a common layer of the plurality of organic light-emitting diodes and the conductive layer are connected to each other through the contact area, and wherein the conductive layer is on a different layer than pixel electrodes of the plurality of organic light-emitting diodes.

13. The organic light-emitting display apparatus of claim 12, wherein the conductive layer at least partially overlaps the pixel electrodes of the plurality of organic light-emitting diodes.

14. An organic light-emitting display apparatus comprising:

a substrate;

a plurality of organic light-emitting diodes on the substrate;

a pixel-defining layer covering an edge of a pixel electrode of each of the organic light-emitting diodes and exposing a center portion of the pixel electrode;

a spacer arranged on the pixel-defining layer between the plurality of organic light-emitting diodes and protruding from an upper surface of the pixel-defining layer;

a first line overlapping the spacer; and a contact area exposing the first line at a side of the spacer, wherein a common layer of the plurality of organic light-emitting diodes and the first line are connected to each other through the contact area, and wherein the common layer includes at least one of an electron injection layer, an electron transport layer, a hole injection layer, or a hole transport layer, and the at least one of the electron injection layer, the electron transport layer, the hole injection layer, or the hole transport layer is continuously disposed from the contact area to an upper surface of the spacer.

15. The organic light-emitting display apparatus of claim 14, wherein the contact area surrounds the spacer.

16. The organic light-emitting display apparatus of claim 14, wherein the first line is on same layer as the pixel electrodes of the plurality of organic light-emitting diodes and is spaced apart from the pixel electrodes.

17. The organic light-emitting display apparatus of claim 14, wherein the first line is configured to transmit a common power supply voltage.

18. The organic light-emitting display apparatus of claim 14, further comprising:

a thin-film transistor on the substrate; and a first planarization layer and a second planarization layer arranged and stacked between the thin-film transistor and the plurality of organic light-emitting diodes, wherein the first line is between the first planarization layer and the second planarization layer.

19. The organic light-emitting display apparatus of claim 14, further comprising a sealing substrate arranged to face the substrate.

20. The organic light-emitting display apparatus of claim 14, further comprising a thin-film encapsulation layer arranged to cover the plurality of organic light-emitting diodes, wherein the thin-film encapsulation layer comprises a first inorganic encapsulation layer, an organic encapsulation layer, and a second inorganic encapsulation layer that are sequentially stacked.

* * * * *